United States Patent
Visconti et al.

(10) Patent No.: US 7,535,770 B2
(45) Date of Patent: May 19, 2009

(54) FLASH MEMORY DEVICE WITH REDUCED DRAIN STRESSES

(76) Inventors: Angelo Visconti, Via Colombo, 27, I-22070 Appiano Gentile (CO) (IT); Silvia Beltrami, Via Don G. Brugnetti, 13, I-24010 Sorisole (BG) (IT)

( * ) Notice: Subject to any disclaimer, the term of this patent is extended or adjusted under 35 U.S.C. 154(b) by 273 days.

(21) Appl. No.: 11/703,535

(22) Filed: Feb. 6, 2007

(65) Prior Publication Data
US 2007/0237001 A1 Oct. 11, 2007

(30) Foreign Application Priority Data
Feb. 6, 2006 (EP) .................................. 06101314

(51) Int. Cl.
*G11C 11/34* (2006.01)
(52) U.S. Cl. .............................. 365/185.28; 365/185.18; 365/185.05
(58) Field of Classification Search ............. 365/185.28, 365/185.18, 185.05
See application file for complete search history.

(56) References Cited

U.S. PATENT DOCUMENTS

| | | | | |
|---|---|---|---|---|
| 5,923,585 | A | 7/1999 | Wong et al. | |
| 6,301,158 | B1 * | 10/2001 | Iwahashi | 365/185.23 |
| 6,416,556 | B1 | 7/2002 | Park | |
| 6,804,150 | B2 * | 10/2004 | Park et al. | 365/185.18 |
| 7,382,656 | B2 * | 6/2008 | Ho et al. | 365/185.22 |
| 2003/0048662 | A1 * | 3/2003 | Park et al. | 365/185.18 |
| 2005/0007824 | A1 | 1/2005 | Chih | |
| 2007/0211537 | A1 * | 9/2007 | Park et al. | 365/185.22 |

FOREIGN PATENT DOCUMENTS

JP 2001184878 A 7/2001

OTHER PUBLICATIONS

European Search Report for EP 06 10 1314 dated Aug. 17, 2006.

* cited by examiner

*Primary Examiner*—Tuan T. Nguyen
(74) *Attorney, Agent, or Firm*—Blakely, Sokoloff, Taylor & Zafman LLP

(57) ABSTRACT

A memory device includes a matrix of memory cells arranged in a plurality of rows and a plurality of columns, each memory cell including a transistor having a first conduction terminal, a second conduction terminal and a control terminal; a plurality of bit lines each one associated with a column, each transistor of the column having the first conduction terminal coupled with the associated bit line; a plurality of first biasing lines each one associated with a row, each transistor of the row having the control terminal coupled with the associated first biasing line; a plurality of second biasing lines each one associated with at least one row, each transistor of the at least one row having the second conduction terminal coupled with the associated second biasing line; and means for programming at least one selected memory cell belonging to a selected row. The means for programming includes first biasing means for applying a programming voltage at least to a selected first biasing line associated with the selected row, and second biasing means for applying a program enabling voltage to a selected second biasing line associated with the selected row, each memory cell being programmed only when receiving both the programming voltage and the program enabling voltage.

30 Claims, 2 Drawing Sheets

FLASH MEMORY DEVICE WITH REDUCED DRAIN STRESSES

PRIORITY CLAIM

This application claims priority from European patent application No. EP06101314.0, file Feb. 6, 2006, which is incorporated herein by reference.

TECHNICAL FIELD

An embodiment of the present invention relates to the data storage field, more specifically relates to a non-volatile memory device.

BACKGROUND

Non-volatile memory devices (such as flash $E^2PROMs$) are commonly used to store information, which must be preserved even in the absence of an electric power source that supplies the memory device. Typically, the memory device includes a matrix of memory cells, for example, arranged in rows and columns. Each memory cell consists of a MOS transistor having a floating gate insulated from both a channel and a control gate by oxide layers. The transistor is programmed by injecting an electric charge into its floating gate, exploiting a physical phenomenon known as Channel Hot Electron (CHE) injection. The electric charge in the floating gate modifies the threshold voltage of the transistor, in such a way as to define different logic values. The transistors are erased in blocks by removing the electric charge from their floating gates.

The memory device further includes a bit line for each column of the matrix, and a word line for each row of the matrix. A typical matrix architecture is the so-called NOR architecture, according to which all the memory cells of a same column are connected, in parallel to each other and by their drain terminals, to a same bit line, while all the memory cells of a same row are connected by their control gate terminals to a same word line.

Typical NOR flash memories are manufactured in such a way that a source region is generally realized by means of a single source diffusion for the memory cells belonging to a same word line. Said source diffusion is connected to a metallic line every, e.g., 16 memory cells along the word. All the source diffusions are short-circuited to each other.

According to an alternative known manufacturing typology, each source diffusion (for the memory cells belonging to a same word line) is connected to an independent metallic line, which can be accessed individually. In this way, each source line is electrically independent from the others, so as to increase the granularity of the erase operations.

Normally, for programming a selected memory cell, voltage pulses are simultaneously applied to the control gate terminal and to the drain terminal of the corresponding transistor. This operation can be performed in the matrix by selectively applying the pulses to the word line at which the control gate of the selected transistor is connected, and to the bit line at which the drain of the selected transistor is connected. Consequently, a lateral electric field occurs between the drain and the source of the selected transistor; such lateral electric field is capable to energize (or "heat") the electrons that are present in its channel. Moreover, also a transversal electric field occurs between the channel and the control gate of the selected transistor. The transversal electric field promotes the injection of the electrons that are sufficiently energized (CHE) through the oxide layer separating the channel from the floating gate. The occurrence of such electron injection starts when the magnitude of the transversal electric field is sufficiently high (depending on the thickness of the oxide layer). During this operation the source terminals of all the transistors are kept to a reference voltage (or ground). In some applications, wherein insulation by triple-well can be exploited for the manufacturing of the memory device, the substrate in which the transistors are integrated can be biased with a negative voltage in such a way to increase the injection efficiency (Channel Initiated Secondary Electron Injection (CHISEL) effect).

Therefore, during a program operation, only the bit lines and the word line at which the selected memory cells belong to are biased with positive voltages, while all the other word lines are normally kept grounded and all the other bit lines are normally kept floating.

This biasing scheme is however not optimal, because it implies the occurrence of parasitic phenomena that may dangerously damage the oxide layer separating the channel from the floating gate and, in case the entity of such parasitic phenomena are strong enough, may affect the state of other memory cells of the matrix. More particularly, the unselected memory cells sharing the same bit line with a selected memory cell under programming are subjected to a positive drain voltage and to a null control gate voltage (with a negative substrate voltage, if it is possible, and a null source voltage). Each one of the corresponding transistors is in an electrical condition favorable for the occurrence of a physical phenomenon known as Band to Band Tunneling (BBT). According to such phenomenon, electron-hole pairs are generated at the reverse biased drain/substrate junction by electron tunneling, thereby provoking a parasitic drain stress capable to degrade the content of the memory cell itself. As it is known from experimental analysis results, the number of electron-hole pairs that are generated in this way increases if the voltage difference between the control gate terminal and the channel has a negative value, as in the case of a programmed cell (wherein a quantity of negative electrical charge is trapped within its floating gate, with a null control gate voltage). Furthermore, in this case the holes generated by the BBT phenomenon are injected into the oxide layer, which is thus subjected to an excessive stress that may result in a critical damage thereof; in turn, this provokes the generation of an anomalous Stress Induced Leakage Current (SILC), i.e., a current through the oxide layer when an electrical field of low intensity is induced across the oxide layer itself. The presence of such a current may cause an increasing or a decreasing of the electrical charge stored in the floating gate, which is even capable to change the state of the memory cell in an incorrect way.

SUMMARY

An embodiment of the present invention reduces the parasitic drain stress during the program operations.

Particularly, an embodiment of the present invention provides a non-volatile memory device. Said memory device includes a matrix of memory cells arranged in a plurality of rows and a plurality of columns; each memory cell includes a transistor having a first conduction terminal (such as a drain), a second conduction terminal (such as a source) and a control terminal (such as a control gate). The memory device includes a plurality of bit lines, each one associated with a column; each transistor of the column has the first conduction terminal coupled with the associated bit line. The memory device further includes a plurality of first biasing lines (such as word lines), each one associated with a row; each transistor of the row has the control terminal coupled with the associated first biasing line. Moreover, the memory device includes a plurality of second biasing lines (such as source lines), each one associated with at least one row; each transistor of the at least one row has the second conduction terminal coupled with the associated second biasing line. Means is used for programming one or more selected memory cells belonging to a selected row. The means for programming includes first biasing means for applying a programming voltage (such as 6-9 V) at least to a selected first biasing line associated with the selected row; second biasing means is provided for applying a program enabling voltage (such as the ground voltage) to a selected second biasing line associated with the selected row; each memory cell is programmed only when receiving both the programming voltage and the program enabling voltage.

In an embodiment of the present invention, the unselected source lines are keep floating.

According to an embodiment of the present invention, the program voltage is applied to all the word lines with the exception of a shielding subset.

Alternatively, the program voltage is applied to the selected word line only, while a compensation voltage is applied to the other word lines with the exception of a shielding subset.

According to an embodiment of the present invention, in both cases the shielding subset is empty.

Alternatively (when each source line is associated with a pair of rows), the shielding subset consists of the word line associated with the other row in the pair including the selected row.

According to a further embodiment of the invention, the shielding subset consists of the word lines adjacent to the word line of the selected row.

In a preferred embodiment of the present invention each transistor is a floating gate MOS transistor.

According to an embodiment of the present invention, the programming voltage is different from the program enabling voltage, and the compensation voltage is comprised between the program enabling voltage and the programming voltage.

Another embodiment of the present invention provides a corresponding method for programming a non-volatile memory device.

BRIEF DESCRIPTION OF THE DRAWINGS

Embodiments of the invention, as well as features and advantages thereof, will be best understood by reference to the following detailed description, given purely by way of a non-restrictive indication, to be read in conjunction with the accompanying drawings, wherein.

DETAILED DESCRIPTION

Figure 1:
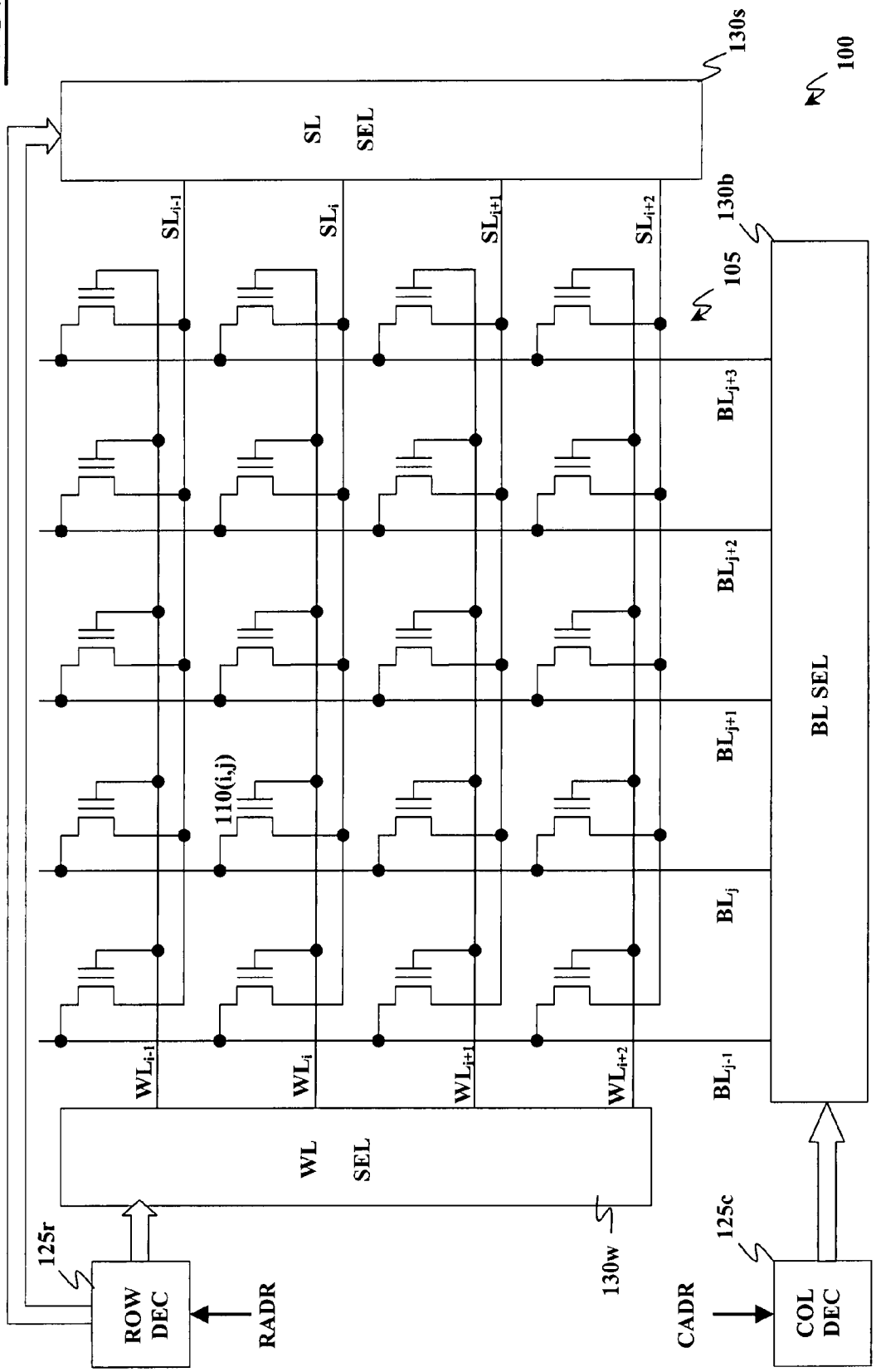
FIG. 1 is a block diagram of a non-volatile memory device, particularly of the NOR type, according to a first embodiment of the present invention.

With reference to the drawings, in FIG. 1 a non-volatile memory device 100, in particular a flash E²PROM, is illustrated according to an embodiment of the present invention. The flash memory 100 is integrated in a chip of semiconductor material, and includes a matrix 105 of memory cells 110($i,j$); typically, each memory cell 110($i,j$) consists of a floating gate NMOS transistor having a drain terminal, a source terminal and a control gate terminal. In an erased condition, the memory cell 110($i,j$) has a low threshold voltage. The memory cell 110($i,j$) is programmed by injecting electric charges into its floating gate; in the programmed condition, the memory cell 110($i,j$) has a higher threshold voltage. The threshold voltage of the transistor defines different conductivity states (associated with corresponding logic values) when the memory cell 110($i,j$) is biased for reading. For example, in a four-level flash memory 100, the threshold voltage of a generic memory cell 110($i,j$) can take one of four different levels (associated with the logic values "00", "01", "10" and "11").

The matrix 105 is typically partitioned into a plurality of memory sectors. The memory cells 110($i,j$) of a generic memory sector are organized in a plurality of rows (for example, 2048) and a plurality of columns (for example, 4096). To each row there is associated a respective word line WLi (i=0 to 2047), while to each column there is associated a respective bit line BLj (j=0 to 4095). Moreover, according to an embodiment of the present invention, to each row there is also associated a respective source line SLi (i=0 to 2047).

The flash memory 100 has a so-called NOR architecture, in which the memory cells 110($i,j$) of a same column are all connected by their drain terminals in parallel to the bit line BLj corresponding to said column, and the memory cells 110($i,j$) of a same row are all connected by their control gate terminals to the word line WLi corresponding to said row. Moreover, the memory cells 110($i,j$) of a same row are also connected by their source terminals to the source line SLi corresponding to said row. The flash memory 100 includes a row decoder 125$r$ adapted to receive a row address RADR and to drive a word line selector 130$w$ and a source line selector 130$s$ accordingly. The flash memory 100 further includes a column decoder 125$c$ adapted to receive a column address CADR and to drive a bit line selector 130$b$ accordingly.

During a program operation, a set of memory cells is selected according to the addresses CADR, RADR (hereinafter, all the selected elements will be identified with the index "s" for the rows, and with the index "t" for the columns). Particularly, the column decoder 125$c$ receives the column address CADR, decodes it and selects corresponding columns (typically, eight or sixteen columns, depending on the memory parallelism). Particularly, the column decoder 125$c$ biases the selected bit lines BLt by means of the bit line selector 130$b$ to a positive voltage, for example, to a supply voltage Vdd of the flash memory 100 (such as 3.3 V with respect to ground); the other bit lines BLj are instead kept floating.

At the same time, the row decoder 125$r$ receives the row address RADR, decodes it and selects a corresponding row. Particularly, according to a first embodiment of the present invention, the row decoder 125$r$ biases all the word lines WLi by means of the word line selector 130$w$ to a program voltage Vpw (for example, having a value of 6-9 Volts). Furthermore, the row decoder 125$r$ biases the selected source line SLs by means of the source line selector 130$s$ to the ground voltage (GND), while the other source lines SLi are kept floating.

In this way, a row is selected by means of the sources of the transistors 110($s,j$) belonging to the row itself, and not, as usual, by means of their control gates. Since all the word lines WLi are biased with the program voltage Vpw, all the transistors 110($i,j$) have their conductive channels that are formed. However, since the unselected source lines SLi and/or the unselected bit lines BLj are kept floating, ideally no current can flow in the corresponding transistors 110($i,j$); thereby the electrons that are present in their channels cannot be energized, so that no CHE injection occurs. Conversely, the only transistor 110($s,t$) that is subjected to the condition of CHE injection is the one corresponding to the selected bit line BLt and to the selected source line SLs.

Thanks to this biasing solution, the parasitic drain stress effect is strongly reduced within the whole memory sector. In fact, the memory cells 110(i,t) belonging to the selected bit line BLt are in electrical conditions unfavorable for the occurrence of the BBT phenomenon. Indeed, by biasing the control gate terminals of all the memory cells 110(i,j) with a positive voltage Vpw that is sufficiently high, the voltage difference between their control gate terminals and their channels is kept positive, even for the programmed memory cells 110(i,j), and so the BBT phenomenon is substantially prevented. Moreover, even if some electron-hole pairs are generated in the proximity of the drain/substrate junction, said positive voltage difference avoids any hole injection in the oxide layer, and so avoids its damage and the generation of any unwanted SILC phenomenon.

Nevertheless, the programming of a generic selected memory cell 110(s,t) (even with such a biasing scheme) might affect the state of the memory cells 110(i,j) in the proximity thereof. More particularly, since all the memory cells 110(i,j) in the memory sector have their conductive channel that is formed, a plurality of alternative conductive paths now exists between the drain terminal of the selected memory cell 110 (s,t) and the selected source line SLs. Consequently, an amount of electrical charge might be conveyed through the conductive channels of the memory cells 110(i,j) in the proximity of the selected memory cell 110(s,t) by means of said alternative conductive paths; this may increase the drain voltages of said memory cells 110(i,j), and thus may provoke spurious charge injections that affect their states if said voltage increase is high enough. For example, the electrical charge stored in the parasitic capacitances (not shown in Figure) of the selected bit line BLt is capable to reach the selected source line SLs not only through the selected memory cell 110(s,t), but also passing through (in sequence): the conductive channel of the memory cell 110(s−1,t), the conductive channel of the memory cell 110(s−1,t−1) and the conductive channel of the memory cell 110(s,t−1). It has to be noted that, even if the source line SL(s−1) is kept floating by the source line selector 130s, the tract thereof connecting the source terminal of the memory cell 110(s−1,t) with the source terminal of the memory cell 110(s−1,t−1) represents a conductive path adapted to convey electrical charge from the memory cell 110(s−1,t) to the memory cell 110(s−1,t−1). Nevertheless, only a small fraction (generally not sufficient to involve spurious charge injections) of the voltage applied to the selected bit line BLt reaches the memory cells 110(i,j) in the proximity of the selected memory cell 110(s,t), because of the presence of the resistances introduced by each memory cell 110(i,j) along the various alternative conductive paths. Moreover, since the resistance introduced by a generic memory cell 110(i,j) in an alternative conductive path depends on its threshold voltage, the presence in the conductive path of a single programmed memory cell 110(i,j) (having a high threshold voltage) is sufficient to entirely avoid any occurrence of spurious charge injections.

However, a solution for completely removing that undesired effect consists of properly biasing the memory cells 10(i,j) belonging to the rows adjacent to the selected row, in such a way to avoid the formation of their conductive channels; this allows interrupting any alternative conductive path capable to couple the drain terminal of the selected memory cell 110(s,t) with the selected source line SLs. For this purpose, according to a further embodiment of the present invention, all the word lines of the memory sector with the exception of the word lines WL(s−1) and WL(s+1), i.e., the ones adjacent to the selected word line WLs, are biased to the program voltage Vpw by means of the word line selector 130w, while the word lines WL(s−1) and WL(s+1) are instead biased to the ground voltage GND.

Nevertheless, thanks to the biasing of the word lines WL(s−1) and WL(s+1) to the ground voltage GND, the memory cells 110(s+1,t) and 110(s−1,t) have the drain terminal at a positive voltage (Vdd) and the control gate at a low voltage (GND), i.e., they are in an electrical condition favorable to the occurrence of the BBT phenomenon, and, consequently of the drain stress effect. However, since said effect may occur only for the two memory cells mentioned above, the global effect of the SILC phenomenon within the memory sector of the matrix 105 is substantially negligible.

As a further improvement, the word line selector 130w is adapted to bias the selected word line WLs only with the program voltage Vpw, and the unselected word lines WLi with a proper compensation voltage Vcw. The value of said compensation voltage Vcw is based on the threshold voltage that a programmed memory cell 110(i,j) may typically assume. In fact, the BBT phenomenon is triggered when a negative voltage difference occurs between the control gate and the channel; a negative voltage contribution to said voltage difference is generated by the electrical charge stored in the floating gate of a programmed memory cell, which defines the value of the threshold voltage of the corresponding transistor.

Therefore, in order to avoid the occurrence of the BBT phenomenon, the compensation voltage Vcw has to be at least equal to the typical threshold voltage assumed by a generic programmed cell (for example, 3 Volts).

Figure 2:
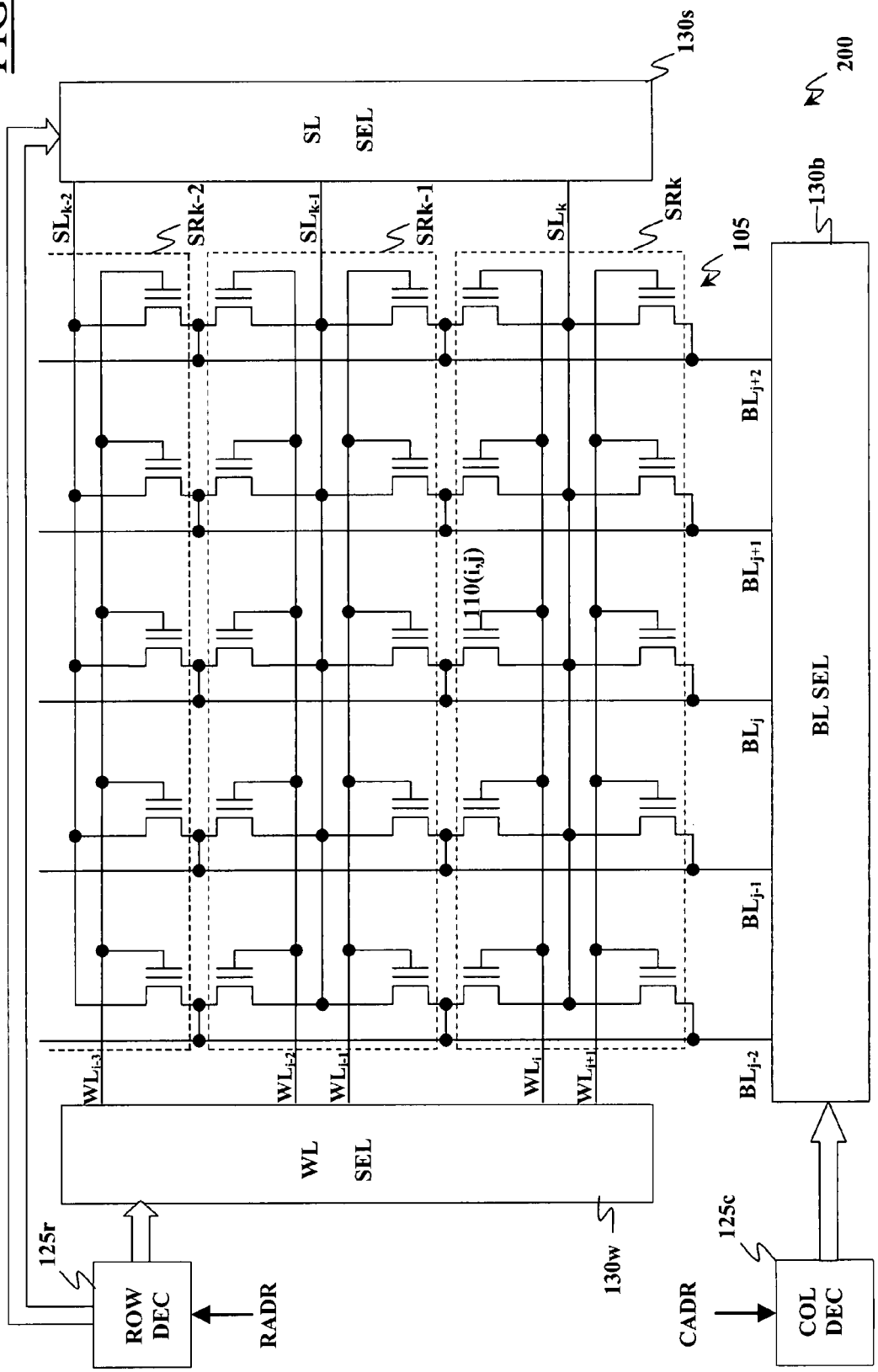
FIG. 2 is a block diagram of a non-volatile memory device, particularly of the NOR type, according to a second embodiment of the present invention.

Considering now FIG. 2, a flash memory 200 is illustrated according to a further embodiment of the present invention. The elements corresponding to the ones shown in the FIG. 1 are denoted with the same references, and their explanation is omitted for the sake of brevity. The flash memory 200 still includes a matrix 105 of memory cells 110(i,j) having a NOR architecture, but, according to this embodiment, the memory cells 110(i,j) are arranged in such a way to present a more compact topological structure in comparison with that of FIG. 1.

More particularly, the memory cells 110(i,j) of a generic memory sector are still organized in a plurality of rows (for example, 2048) and a plurality of columns (for example, 4096); to each row there is associated a respective word line WLi (i=0 to 2047), while to each column there is associated a respective bit line BLj (j=0 to 4095). However, the rows are now grouped in subsets SRk (k=0 to 1023), each one including a pair of adjacent rows. Moreover, to each subset SRk there is associated a source line SLk (k=0 to 1023).

As above, the memory cells 110(i,j) of a same column are all connected by their drain terminals in parallel to the bit line BLj corresponding to said column, and the memory cells 110(i,j) of a same row are all connected by their control gate terminals to the word line WLi corresponding to said row. Moreover, the memory cells 110(i,j) of a same subset SRk are also connected by their source terminals to the source line SLk corresponding to said subset SRk. In this way, the number of source lines SLk is halved in comparison with the case illustrated in FIG. 1, thus allowing saving silicon area within the chip of semiconductor material in which the flash memory 200 is integrated. Moreover, with such a topological structure, the number of contacts necessary for connecting the memory cells 110(i,j) with the source lines SLk (each contact with a line occupying a non negligible silicon area) is also reduced.

As in the preceding case, during a program operation, the selected bit lines BLt are biased to the supply voltage Vdd by the bit line selector 130b, while the other bit lines BLj are instead kept floating.

On the other hand, all the word lines are biased to the program voltage Vpw by means of the word line selector 130w, with the exception of the word line WL(s+1) belonging to the subset SRu of the selected word line WLs (hereinafter, the selected subset and its corresponding source line will be identified with the index "u"). Said word line WL(s+1) is instead biased to the ground voltage GND. Furthermore, the selected source line SLu is biased to the ground voltage GND by the source line selector 130s, while the other source lines SLk are kept floating.

In this case, since the selected source line SLu corresponds to two rows belonging to the same subset SRu, biasing it to the ground voltage GND brings the source of all the memory cells 110(i,j) corresponding to the selected subset SRu to the ground voltage GND. This means that not only the selected memory cells 110(s,t) (connected to the selected bit lines BLt and to the selected word line WLs) are subjected to the condition of CHE injection (and so are programmed), but also the memory cells 110(s+1,t) connected to the selected bit lines BLt and to the word line WL(s+1) would be programmed. In order to prevent the occurrence of said incorrect programming, the word line WL(s+1) is biased to the ground voltage GND, in such a way to avoid the generation of the conductive channel in all the memory cells 110(s+1,j) connected thereto (comprising the one connected to the selected bit lines BLt).

Thanks to said biasing solution, the parasitic drain stress effect is strongly reduced within the whole memory sector, with the exception of the memory cell 110(s+1,t) connected to the word line WL(s+1). In fact, all the memory cells 110(i,t) belonging to the selected bit lines BLt, with the exception of the ones connected to the word line WL(s+1), are in electrical conditions unfavorable for the occurrence of the BBT phenomenon, as previously described with reference to the FIG. 1. The memory cell 110(s+1,t) has instead the drain terminal at a positive drain voltage (Vdd) and the control gate at a low voltage (GND), i.e., it is in an electrical condition favorable for the occurrence of the BBT phenomenon. If said memory cell 110(s+1,t) is programmed, i.e., if it has a quantity of electrical charge stored in its floating gate, hole injection in the oxide layer may occur, generating an unwanted SILC phenomenon. However, since said effect may occur only for the single memory cell mentioned above, the global effect of the SILC phenomenon within the memory sector of the matrix 105 is substantially negligible.

Furthermore, as in the case illustrated referring to FIG. 1, adopting this biasing solution allows the generation of alternative conductive paths capable to couple the drain terminal of each selected memory cell 110(s,t) with the selected source line SLu. Since the word line WL(s+1) is already biased to the ground voltage GND, said alternative conductive paths may occur only for the memory cells 110(i,j) connected to the word lines WL0-WL(s-1). As in the case previously described, a solution for completely removing any occurrence of spurious charge injections given by the presence of alternative conductive paths consists of biasing the word line WL(s-1) to the ground voltage GND as well.

Moreover, as previously described, it is not really necessary to bias all the unselected word lines (in this case, with the exception of the word line WL(s+1)) to the program voltage Vpw. Consequently, according to a further embodiment of the present invention, the word line selector 130w is adapted to bias the selected word line WLs to the program voltage Vpw, the word line WL(s+1) belonging to the selected subset SRu to the ground voltage GND, and the other word lines to the compensation voltage Vcw.

An alternative (but not optimal) solution for limiting the occurrence of the BBT phenomenon consists of biasing both the drain and the source of the unselected memory cells 110(i,j) to the same (positive) voltage, in such a way to prevent any electron-hole pairs generation given by tunneling effect. However, in this way both the drain/substrate junctions and the source/substrate junctions of the unselected memory cells 110(i,j) are reverse biased. Since each reverse biased junction originates a parasitic leakage current (which, however, is negligible individually), by reverse biasing too many semiconductor junctions may negatively affect the correct functioning of the whole memory device.

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components (such as another number of sectors, down to a single one, and another number of rows or columns).

Moreover, the row decoder and the column decoder may be combined into a single component.

Alternatively, the unselected bit lines may be biased to the reference voltage.

Moreover, the solution according to the present invention lends itself to be applied to an $E^2PROM$, or more generally to any other non-volatile memory device.

It should be appreciated that the values of the different biasing voltages are merely illustrative, and they are not to be interpreted in a limitative manner.

Even though the proposed solution has been specifically designed for use with MOS transistors, its application to different memory cells is not excluded.

The invention claimed is:
1. A non-volatile memory device including:
   a matrix of memory cells arranged in a plurality of rows and a plurality of columns, each memory cell including a transistor having a first conduction terminal, a second conduction terminal and a control terminal;
   a plurality of bit lines each one associated with a column, each transistor of the column having the first conduction terminal coupled with the associated bit line;
   a plurality of first biasing lines each one associated with a row, each transistor of the row having the control terminal coupled with the associated first biasing line;
   a plurality of second biasing lines each one associated with at least one row, each transistor of the at least one row having the second conduction terminal coupled with the associated second biasing line; and
   means for programming at least one selected memory cell belonging to a selected row,
   wherein the means for programming includes:
   first biasing means for applying a programming voltage at least to a selected first biasing line associated with the selected row, and second biasing means for applying a program enabling voltage to a selected second biasing line associated with the selected row, each memory cell being programmed only when receiving both the programming voltage and the program enabling voltage.

2. The memory device of claim 1, wherein the second biasing means is adapted to keep floating the unselected second biasing lines.

3. The memory device of claim 1, wherein the first biasing means is adapted to apply the programming voltage to all the first biasing lines with the exception of a shielding subset of the first biasing lines, the first biasing lines of the shielding subset receiving substantially the same voltage as the selected second biasing line.

4. The memory device of claim 1, wherein the first biasing means is adapted to apply the programming voltage to the selected first biasing line and to apply a compensation voltage corresponding to a threshold voltage of the programmed memory cells to the other first biasing lines with the exception of a shielding subset of the first biasing lines, the first biasing lines of the shielding subset receiving substantially the same voltage as the selected second biasing line.

5. The memory device of claim 3, wherein the shielding subset is empty.

6. The memory device of claim 3, wherein each second biasing line is associated with a pair of rows, the shielding subset including the first biasing line associated with the other row in the pair including the selected row.

7. The memory device of claim 3, wherein the first biasing lines are arranged in a sequence, the shielding subset consisting of the first biasing lines adjacent in said sequence to a selected first biasing line associated with the selected row.

8. The memory device of claim 1, wherein each transistor comprises a floating gate MOS transistor, the first conduction terminal being a drain terminal, the second conduction terminal being a source terminal, and the control terminal being a gate terminal.

9. The memory device of claim 1, wherein the program enabling voltage is substantially equal to a reference voltage, the programming voltage is different from the reference voltage, and the compensation voltage is comprised between the program enabling voltage and the programming voltage.

10. A method for programming a non-volatile memory device including:
a matrix of memory cells arranged in a pluarlity of rows and a plurality of columns, each memory cell including a transistor having a first conduction terminal, a second conduction terminal and a control terminal;
a plurality of first biasing lines each one associated with a column, each transistor of the column having the first conduction terminal coupled with the associated bit line;
a plurality of first biasing lines each one associated with a row, each transistor of the row having the control terminal coupled with the associated first biasing line; and
plurality of second biasing lines each one associated with at least one row, each transistor of the at least one row having the second conduction terminal coupled with the associated second biasing line,
wherein the method includes:
programming at least one selected memeory cell belonging to a selected row,
wherein the programming includes:
applying a programming voltage at least to a selected first biasing line associated with the selected row; and
applying a program enabling voltage to a selected second biasing line associated with the selected row, each memory cell being programmed only when receiving both the programming voltage and the program enabling voltage.

11. A memory, comprising:
first, second, third, and forth non-volatile emeory cells each including resepective first and second conduction nodes and respective control node;
a first word line coupled to the control nodes of the first and second memeory cells;
second word line coupled to the control nodes of the third and fourth memory cells;
a first bit line coupled to the first conduction nodes of the first and third memory cells;
a second bit line coupled to the first conduction nodes of the seond and fourth memory cells;
a first bias line coupled to the second conduction nodes of the first and second memory cells;
a second bias line coupled to the second conduction nodes of the third and fourth memory cells; and
a programming circuit coupled to the word lines, bit lines, and bias lines and operable to program the first memory cell in the first row by
driving a programming voltage onto the first word line,
driving a first compensation voltage onto the seond word line,
driving a bias voltage onto the first bias line, and
causing the second bias line to have a state.

12. The memory of claim 11 wherein:
the first conduction node of each memory cell comprises a drain node; and
the second conduction node of each memory cell comprises a source node.

13. The memory of claim 11 wherein the programming circuit is operable to cause the second bias line to have the state by floating electrically the second bias line.

14. The memory of claim 11, further comprising:
a supply node operable to receive a supply voltage;
wherein the compensation voltage substantially equals the programming voltage; and
wherein the bias voltage substantially equals the supply voltage.

15. The memory of claim 11, further comprising:
a supply node operable to receive a supply voltage;
wherein the bias voltage substantially equals the supply voltage; and
wherein the compensation voltage is between the supply voltage and the programming voltage.

16. The memory of claim 11 wherein the compensation voltage is substantially equal to a threshold voltage of a programmed memory cell.

17. The memory of claim 11 wherein the programming circuit is further operable to program the first memory cell in the first row by:
driving a column voltage onto the first bit line; and
floating electrically the second bit line.

18. The memory of claim 11 wherein the programming circuit comprises:
a row selector coupled to the word lines;
a column selector coupled to the bit lines; and
a bias-line selector coupled to the bias lines.

19. The memory of claim 11, further comprising:
a third word line disposes between the first and second word lines; and
wherein the programming circuit is further operable to program the first memory cell by driving the bias voltage onto the third word line.

20. The memory of claim 11, further comprising:
a fifth memory cell including a first conduction node, a second conduction node coupled to the first bias line, and a control node;
a third word line coupled to the control node of the fifth memory cell; and
wherein the programming circuit is further operable to program the first memory cell by driving the bias voltage onto the third word line.

21. The memory of claim 11 wherein the programming circuit is:
operable to cause the second bias line to have the state by driving a second compensation voltage onto the second bias line; and
further operable to drive the second compensation voltage onto the second bit line.

22. The memory of claim 21 wherein the second compensation voltage comprises a positive voltage.

23. A system, comprising:
a controller; and
a memory coupled to the controller and comprising,
first, second, third, and fourth nonvolatile memory cells each including respective first and second conduction nodes and a respective control node;
a first word line coupled to the control nodes of the first and second memory cells;
a second word line coupled to the control nodes of the third and fourth memory cells;
a first bit line coupled to the first conduction nodes fo the first and third memory cells;
a second bit line coupled to the first conduction nodes of the second and fourth memory cells;
a first bias line coupled to the second conduction nodes of the first and second memory cells;
a second bias line coupled to the second conduction nodes of the third and fourth memory cells; and
a programming circuit coupled to the word lines, bit lines, and bias lines and operable to program the first memory cell in the first row by
driving a programming voltage onto the first word line,
driving a compensation voltage onto the second word line,
driving a bias voltage onto the first bias line, and
causing the second bias line to have a state.

24. A method for programming a first nonvolatile memory cell, comprising:
driving a programming voltage and a bias voltage onto a control node and a source node of the first memory cell; and
driving a first compensation voltage onto a control node of a second memory cell and causing a source node of the second memory cell to have a state while driving the programming and biasing voltages onto the control and source nodes of the first memory cell.

25. The method of claim 24 wherein causing the source node of the second memory cell to have a state comprises floating electrically the source node of the second memory cell.

26. The method of claim 24, further comprising:
driving a column voltage onto a drain node of the first memeory cell; and
floating electrically a drain node of the second memory cell.

27. The method of claim 24, further comprising driving the bias voltage onto a control node of a third memory cell disposed between the first and the second memory cell.

28. The method of claim 24, further comprising driving the bias voltage onto a control node and a source node of a third memory cell disposed between the first and the second memory cell.

29. The method of claim 24, further comprising:
wherein causing the source node of the second memory cell to have a state comprises driving the source node of the second memory cell to a second compensation voltage; and
driving a drain node of the second memory cell to the second compensation voltage.

30. The method of claim 24 wherein the second compensation voltage comprises a positive voltage.

* * * * *